United States Patent
Lindorfer et al.

(10) Patent No.: US 7,420,869 B2
(45) Date of Patent: Sep. 2, 2008

(54) MEMORY DEVICE, USE THEREOF AND METHOD FOR SYNCHRONIZING A DATA WORD

(75) Inventors: Markus Lindorfer, Linz (AT); Johannes Stögmüller, Linz (AT); Christian Steinmayr, Linz (AT)

(73) Assignee: Infineon Technologies AG, Munich (DE)

( * ) Notice: Subject to any disclaimer, the term of this patent is extended or adjusted under 35 U.S.C. 154(b) by 230 days.

(21) Appl. No.: 11/412,755

(22) Filed: Apr. 27, 2006

(65) Prior Publication Data

US 2006/0277426 A1 Dec. 7, 2006

(30) Foreign Application Priority Data

Apr. 27, 2005 (DE) .................... 10 2005 019 568

(51) Int. Cl.
*G11C 8/00* (2006.01)
(52) U.S. Cl. .............. 365/233.1; 365/189.02; 365/221; 713/400
(58) Field of Classification Search .......... 365/233.1, 365/189.02, 221; 713/400
See application file for complete search history.

(56) References Cited

U.S. PATENT DOCUMENTS

| | | | |
|---|---|---|---|
| 4,965,794 A | | 10/1990 | Smith |
| 6,104,770 A | * | 8/2000 | Yama .................... 375/368 |
| 6,338,127 B1 | * | 1/2002 | Manning ................. 711/167 |
| 6,662,304 B2 | * | 12/2003 | Keeth et al. ............. 713/400 |
| 2001/0021142 A1 | * | 9/2001 | Ooishi .................... 365/233 |

FOREIGN PATENT DOCUMENTS

DE   10 2004 043 520 A1   3/2006

* cited by examiner

*Primary Examiner*—Hoai V. Ho
*Assistant Examiner*—Anthan T Tran
(74) *Attorney, Agent, or Firm*—Eschweiler & Associates, LLC

(57) ABSTRACT

The invention includes a memory device with a register device to which an output of a multiplexer is connected. The input of the multiplexer is connected to a buffer store. In addition, the memory device includes a synchronization circuit having a control output connected to a control input of the multiplexer. A clock signal output of the synchronization circuit is connected to the clock input of the register device. The synchronization circuit generates and outputs a clock signal to the clock signal output derived from a time profile for a signal on a state input and from a signal on a second clock input. In this way, a data word to be stored in the register device is synchronized to a clock signal on the second clock input, so that data errors are avoided during transfer.

10 Claims, 5 Drawing Sheets

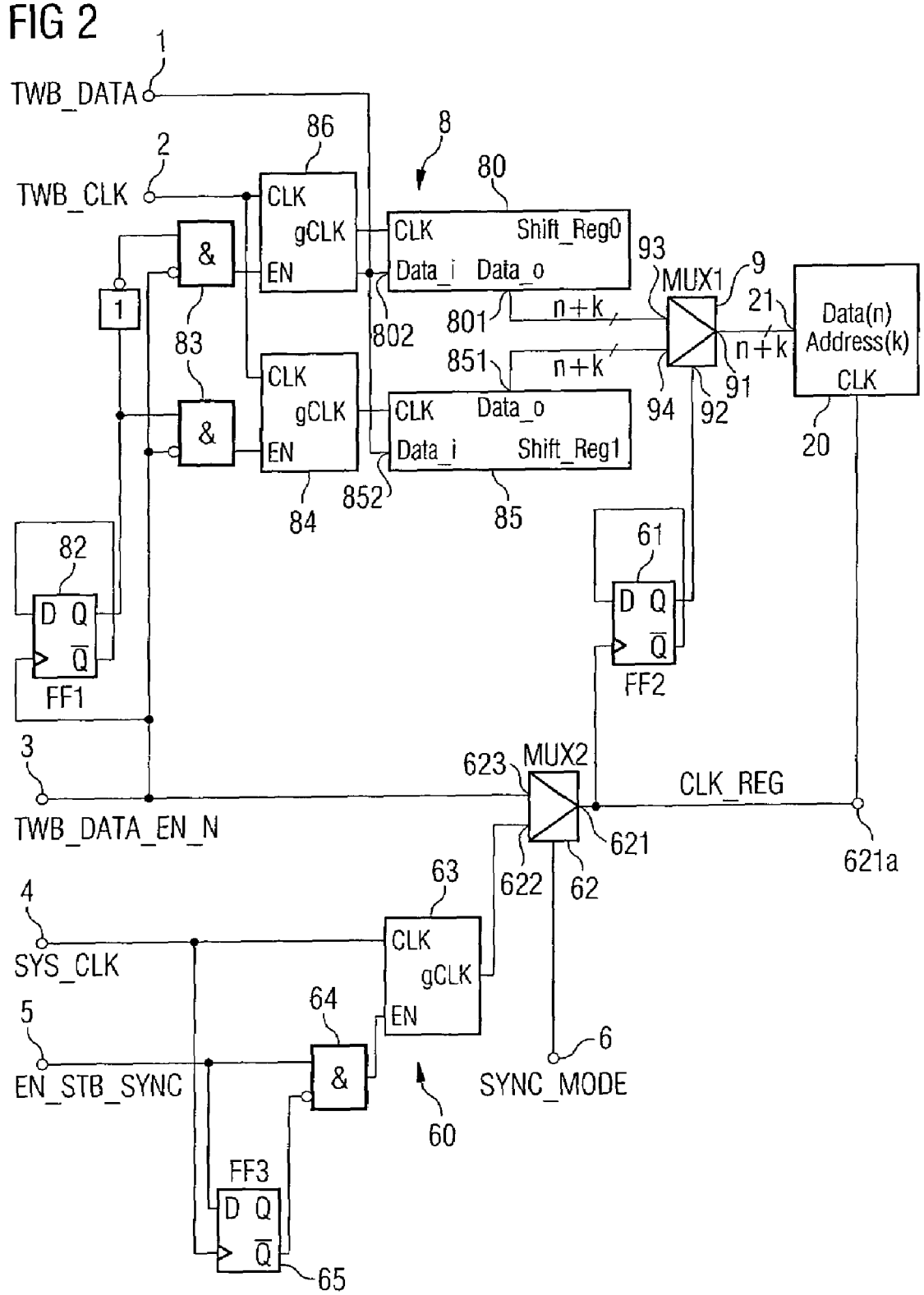

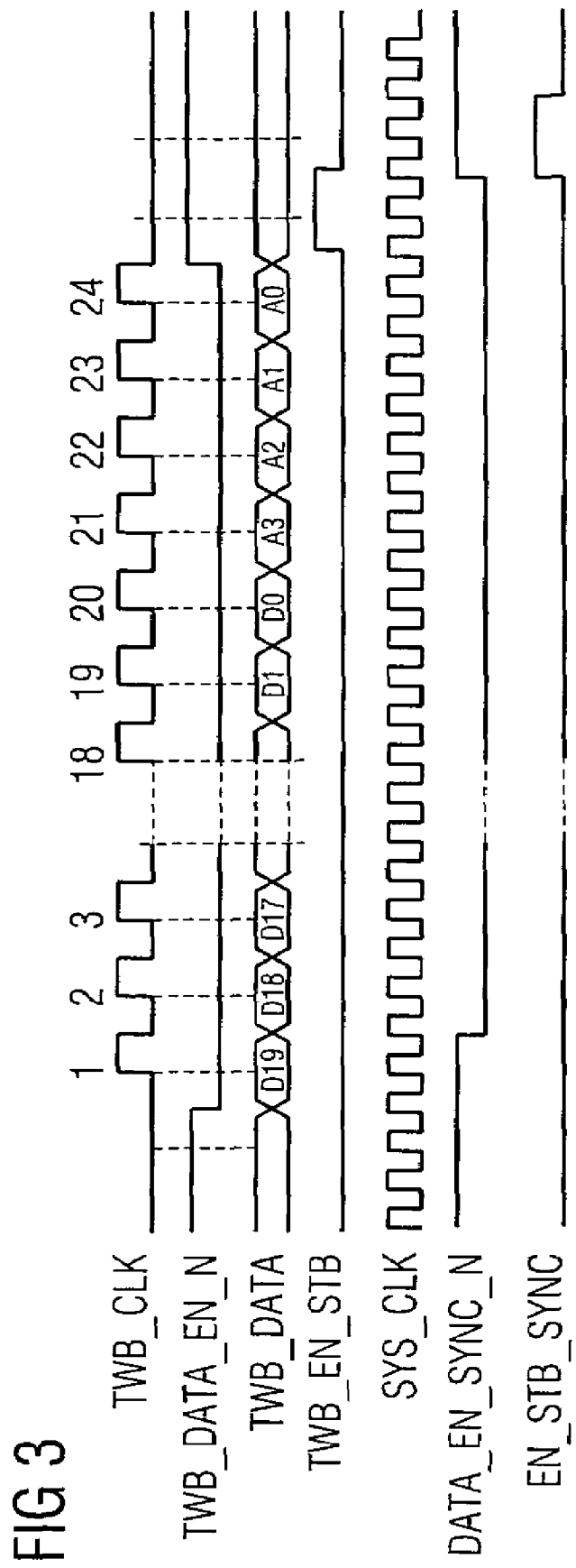

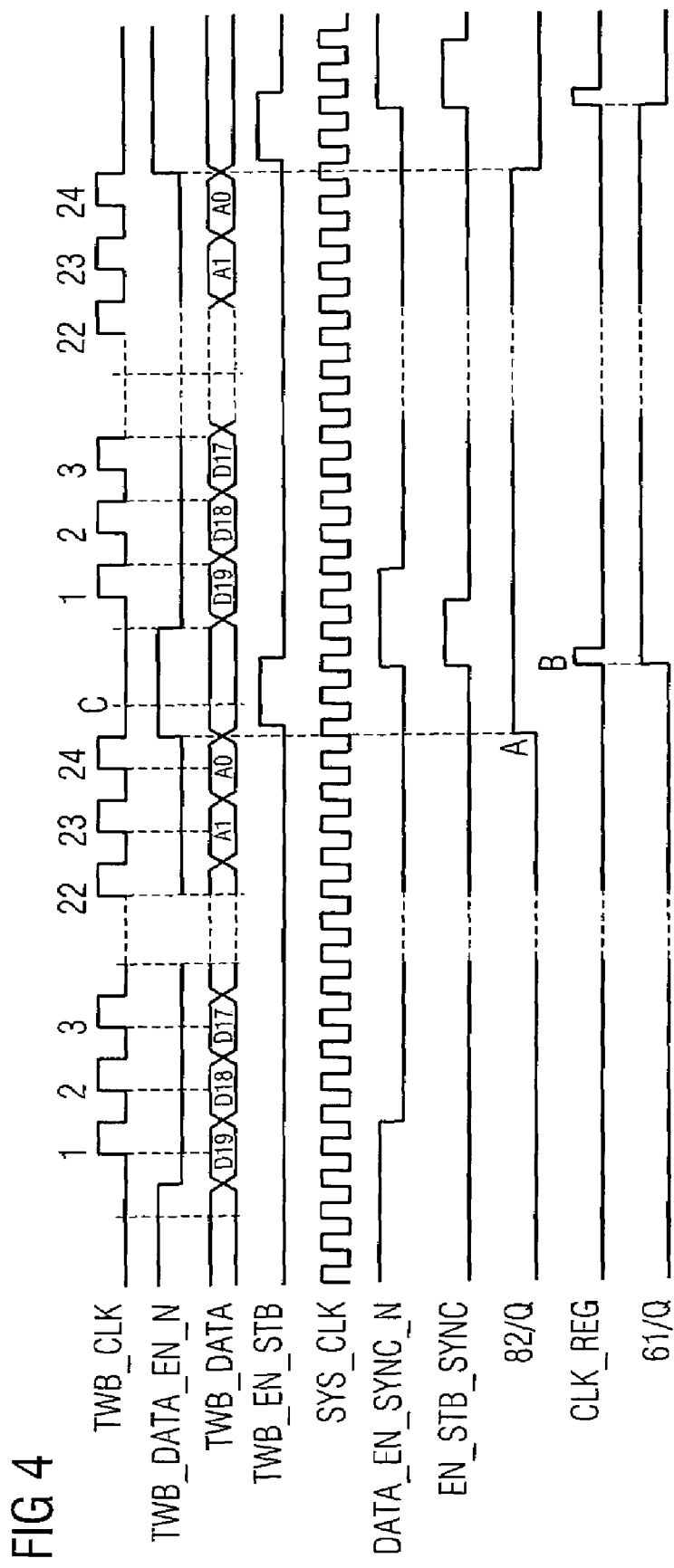

MEMORY DEVICE, USE THEREOF AND METHOD FOR SYNCHRONIZING A DATA WORD

REFERENCE TO RELATED APPLICATIONS

This application claims the benefit of the priority date of German application DE 10 2005 019 568.7, filed on Apr. 27, 2005, the contents of which are herein incorporated by reference in their entirety.

FIELD OF THE INVENTION

The present invention relates to a memory device and to a method for synchronizing a data word. The invention also relates to a use of the memory device for synchronizing data on a three-wire bus.

BACKGROUND OF THE INVENTION

Modern integrated radio-frequency chips have a large number of settable parameters and functions. These include, inter alia, various test functions which check that the individual areas of the radio-frequency chip are operable. In addition, different operating parameters can be set in order to optimize the radio-frequency chip for a particular, partly selectable application. The various functions and settable parameters are no longer actuated via individual control lines, however, but rather the radio-frequency chip communicates with an appropriate control unit via a serial interface. This control unit is also called a host.

A serial programming interface which has found to be particularly advantageous is one with three lines. This three-wire system is also called a three-wire bus. The bus comprises a clock line, a data line and an activation or Enable line. Communication between the control chip and the radio-frequency chip is controlled and driven by the control chip. Following activation of the programming interface by a signal on the Enable line, the control chip outputs a clock signal on the clock line. At the same time, a number of data bits are output on the data line, with preferably each clock edge of the clock signal on the clock line always appearing in the middle of a bit period of a data bit. The radio-frequency chip stores the number of data bits upon every clock edge on the clock line for as long as the signal is present on the Enable line. Suitably, the signal on the Enable line contains two possible states which can be adopted, with a first state existing whenever the control chip is transmitting data to the radio-frequency chip via the serial programming interface.

In this context, the number of data bits on the data line is dependent on various external parameters. In principle, the situation is that the data bits are combined to form a "message" or data word and are respectively stored in a register of a memory in the radio-frequency chip. As the message, a data word with a length of 24 bits has been found to be preferred. Suitably, a number of the 24 bits are defined as an address at the end of the message, so that various registers of the memory can be addressed directly within the radio-frequency chip.

FIG. 6A shows the clock signal TWB_CLK on the clock line, the signals TWB_DATA on the data line and also the signal TWB_DATA_EN_N on the Enable line of a three-wire bus. It can be seen that a rising clock edge in the clock signal TWB_CLK always appears in the middle of a data bit TWB_DATA. During the transmission of the entire message comprising the 19 data bits D19 to D0 and the four address bits A0 to A3, the signal TWB_DATA_EN_N on the Enable line is pulled to the logic low state "Low", and hence it is indicated that data are present on the data line.

In principle, the message length is independent provided that the entire message with its data bits is guaranteed to be able to be stored within a register in the radio-frequency chip.

In addition, it is possible to use the "digital RF standard" (DigRF) for transmitting control parameters via a serial interface and preferably via the three-wire bus. The signals used for this are of similar structure to the signals in the illustration shown in FIG. 6A.

When transmitting signals based on the DigRF standard, a distinction is drawn between a read operation, in which data are read from the memory, and a write operation. Read and write operations are indicated by a first bit, as can be seen from FIGS. 6B and 6C. In addition, the address bits and the data bits of each word on the data line are interchanged. In the case of the DigRF standard, it is also possible to generate signals I2RF_DATA_EN_N of different length on the Enable line, in order to distinguish between read and write operations.

The clock signal TWB_CLK, which is used to write the data to the radio-frequency chip or to read them from it, is usually generated by an external clock generator. The clock signal TWB CLK therefore has an asynchronous profile relative to a system clock which is used and generated internally by the radio-frequency chip. It is therefore necessary to synchronize the data word which is to be transmitted, so that a possible loss of data is avoided. In this case, the synchronization needs to take place at least before the data are processed. The term synchronization is subsequently understood to mean the acceptance or output of data between two circuits which use different clock signals.

In modern radio-frequency chips, there is also the fact that the internally used registers are used in part for clock generation. It may therefore happen that data for storage are applied to a register which is not currently being operated using the system clock generated by the radio-frequency chip.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a memory device which allows provision to be made for data supplied to the memory device externally to be synchronized at a central point. The invention is also directed to a method which allows simple means to be used to synchronize data.

In accordance with one embodiment of the invention, the memory device comprises a register device having a data input and a clock input. The register device is configured to accept a parallel data word on its data input on the basis of a clock signal on the clock input. The data input of the register device has a multiplexer connected thereto which takes a signal on its control input as a basis for coupling one of its two data inputs to its data output. In addition, a buffer store is provided whose output is connected to the two data outputs. The buffer store is configured to accept a serial data word on a data input of the memory device on the basis of signals on a first clock input of the memory device and on a state input of the memory device. The accepted data word is output by the buffer store to one of the two data outputs as a parallel data word.

In one example, the buffer store ensures that synchronization between an external first clock signal on the first clock input of the memory device and a further internal clock signal on a second clock input of the memory device is possible. In addition, a synchronization circuit is provided in one embodiment which has a control output connected to the control input of the multiplexer. The synchronization circuit has a clock signal input which is connected to the clock input of the register device. The synchronization circuit is configured to output a clock signal to the clock signal output, wherein the clock signal is produced from a time profile for a signal on the state input and from a signal on the second clock input.

By virtue of the state input being monitored and, particularly, the state signal being evaluated by the synchronization circuit, the register device, in one embodiment, accepts a parallel data word which is output by the buffer store on one of its two data outputs in sync with the second clock signal on the second clock input of the memory device. Advantageously, in one example this involves the time profile of a signal on the state input and a clock edge of the signal on the state input being registered by the synchronization circuit. This very clock edge is synchronized to the signal on the second clock input in accordance with one embodiment of the invention. As a result, the data words stored in the buffer stores are transferred in sync to the register device, so that a metastable state and a loss of data are avoided.

In addition, in one embodiment the synchronization circuit allows the data word to be transferred from the buffer store to the register device even in the absence of a signal on the second clock input, that is to say when there is no second clock signal.

In another embodiment of the invention, the synchronization circuit comprises a circuit having a control output whose output forms the clock signal output. A first input of the switch is connected to the state input and a second input of the switch is connected to a clock generator. The switch is configured to selectively couple one of its two inputs to its output on the basis of a synchronization signal. The synchronization signal advantageously indicates whether a second clock signal is being applied to the second clock input of the memory device. If so, the switch in one example connects the clock generator to its output. This ensures that the data word is transferred from the buffer store to the register device in sync with the second clock signal.

If, by contrast, the synchronization signal indicates that there is no second clock signal being applied to the second clock input, the switch is put into its first switching state and the signal on the state input is supplied to the register device as a clock signal.

To synchronize the state signal on the state input to the second clock signal on the second clock input, one embodiment of the invention provides a synchronizer having two series-connected flipflops. The latter's clock signal inputs are connected to the second clock signal input, and a data input of the first flipflop is coupled to the state input. An output of the synchronizer is connected to the control input of the switch in the synchronization circuit.

In another embodiment of the invention, the clock generator in the synchronization circuit comprises a clock gate which is configured to output a clock pulse derived from a signal on the second clock input and from a pulse generated from an edge of the state signal. The additional clock gate for outputting a clock pulse ensures that the register device merely has a clock pulse available for accepting the data word from the buffer store. This clock pulse is additionally in sync with the second clock signal, which means that a loss of data and a metastable state within the register device are avoided.

In one example, the control output of the synchronization circuit is coupled to the clock signal output of the synchronization circuit via a feedback flipflop circuit. This arrangement actuates alternately the multiplexer in the memory device, so that it alternately connects the first and the second data input to its data output. Changeover occurs upon each clock pulse on the clock signal output, which in turn controls the transfer of the data word to the register device.

In one embodiment of the invention, the buffer store comprises a first and a second shift register whose inputs are connected to the data input of the memory device in order to supply the serial data word. On the output side, outputs of the shift registers form the first and second data outputs of the buffer store. The shift registers advantageously store the serial data word and output it in parallel to the first and second data outputs. The two shift registers therefore act as serial/parallel converters.

In one example, the buffer store contains an actuating circuit for alternately actuating the first and second shift registers. The actuating circuit is coupled to the first clock input in order to supply the first clock signal and to the state input in order to supply the state signal. The actuating circuit alternately stores a serial data word on the first data input in one of the two shift registers. The effect achieved by this is that a data word stored in the buffer store is not overwritten before it is stored in the downstream register device. This is expedient particularly because synchronization can last some time and during this time there may already be further data applied.

In this regard, in one embodiment of the invention, the buffer store contains a first clock gate having an activation input and a second clock gate having an activation input. The first clock gate is connected to the first shift register in order to actuate it and the second clock gate is connected to the second shift register in order to actuate it. The two activation inputs are coupled to the state input of the memory device. Clock signal inputs of the first and second clock gates are connected to the first clock input in order to supply the first clock signal.

In the case of a method for synchronizing a data word, that is to say for transmitting a data word to a register device, provision is made for a first clock signal, a state signal and a serial data word to be provided. Similarly, a register device is provided in order to store the data word. The serial data word is then buffer-stored using the first clock signal, and a check is performed to determine whether a second clock signal is present. This is necessary in order to ensure that no loss of data occurs. If a second clock signal is present, a clock pulse synchronized to the second clock signal is generated from the state signal and from the second clock signal. The buffer-stored data word is then either transferred to the register device using the clock pulse, for example, by means of appropriate actuation of the register device using the clock pulse, or the buffer-stored data word is transferred to the register device by evaluating the state signal over time.

In other words, if a second clock signal is present, a clock pulse is generated in sync with this clock signal from the state signal, and after the serial data word has been buffer-stored completely it is transferred to the register device using the clock pulse. On account of the synchronism between the clock pulse and the second clock signal, the buffer-stored data word is accordingly also transferred to the register device in sync with the second clock signal. This automatically prevents a loss of data.

The synchronized clock pulse is generated in suitable fashion in one example by generating a pulse when a clock edge appears in the state signal. This pulse can be synchronized to the second clock signal using this signal. The clock pulse for transferring the buffer-stored data is then generated using the synchronized pulse and with a time shift relative to the appearance of the clock edge in the state signal. A time shift relative to the appearance of the clock edge in the state signal is expedient in this example in order to ensure that the serial data word is buffer-stored completely.

In one embodiment the buffer-stored data word is transferred to the register device by means of serial/parallel conversion. Accordingly, a parallel data word is transferred to the register device completely upon a clock pulse. In one example, the parallel data word contains an address portion and a data portion, the address portion being used for addressing a register within the register device, which register is subsequently used to store the data portion.

If there is no second clock signal present, the parallel data word is transferred to the register device when a clock edge appears in the state signal. Expediently, it is also possible for it to be transferred only after a short time delay in the occurrence of this clock edge. This ensures that all buffer-stored data are transferred to the register device and no data errors occur.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below using a plurality of exemplary embodiments with reference to the drawings, in which:

FIG. 2 is a detailed schematic diagram illustrating another exemplary embodiment of the invention, FIG. 3 is a signal timing diagram illustrating various signals to explain the synchronization operation according to one embodiment of the invention, FIG. 4 is a signal timing diagram illustrating various signals associated with a storage operation according to another embodiment of the invention.

DETAILED DESCRIPTION OF THE INVENTION

Figure 1:
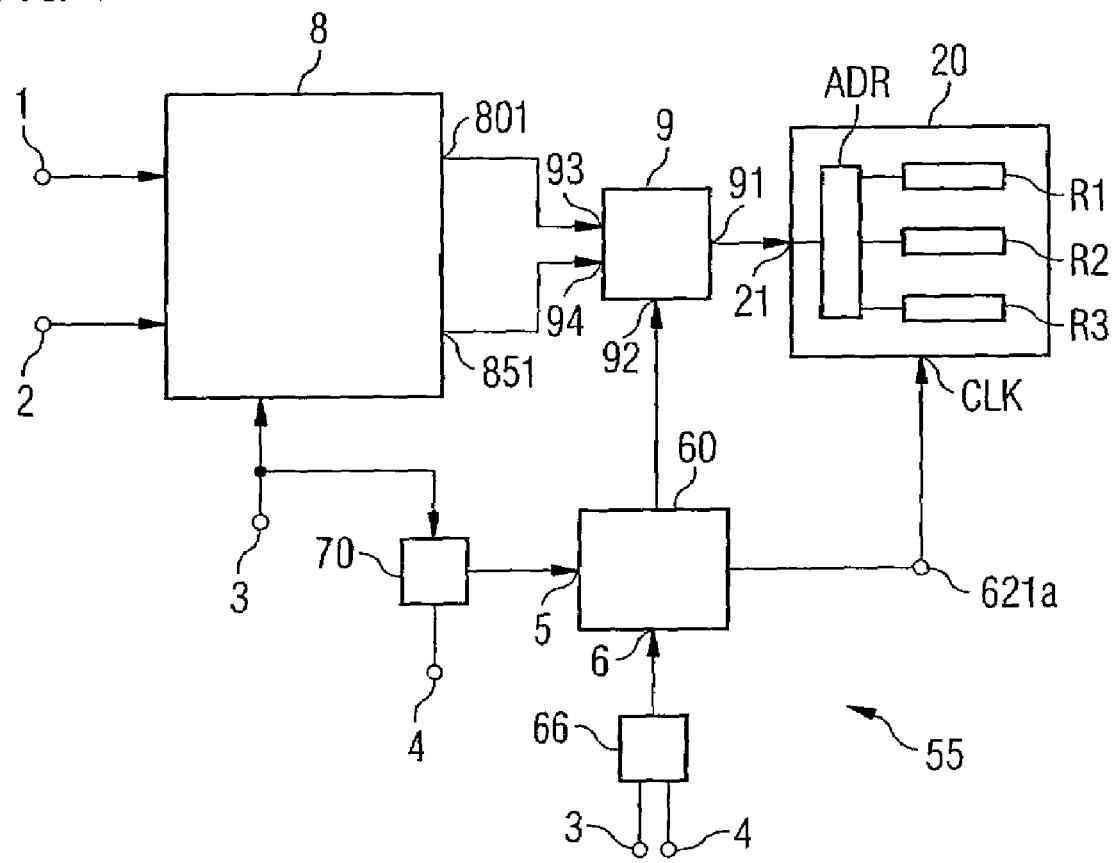
FIG. 1 is a block diagram illustrating one exemplary embodiment of the invention.

FIG. 1 shows an embodiment of the inventive memory device. This is part of a radio-frequency chip (not shown in more detail here) which contains integrated circuits for radio-frequency signal transmission. The memory device is intended to store various operating and settable parameters. These can then be evaluated by the individual circuit elements of the integrated radio-frequency circuit. The parameters stored in the memory device are used to address various functions of the integrated radio-frequency chip and to activate them. By way of example, these may include particular test functions in order to test signal quality or various modes of operation. Other areas are disclosed as customer registers, for example, which users can use to store application-specific data. This makes the integrated radio-frequency chip particularly flexible and allows it to be used for several different applications.

The memory device shown in FIG. 1 shows a register device 20 having an address circuit ADR and a plurality of parallel registers R1, R2 and R3. The register device 20 comprises a data input 21 to which a parallel data word is supplied. The data word supplied in parallel comprises a number of "address bits" which store an address for one of the three registers R1, R2 or R3. The address bits are evaluated by the address unit ADR. In addition, the data word contains a plurality of data bits which are stored in the register R1, R2 or R3 selected by the address unit ADR. The data contents of the individual registers are in turn read by the circuit elements (not shown in more detail) of the radio-frequency chip.

A data word applied to the data input 21 is accepted upon a rising clock edge of a clock signal applied to the clock signal input CLK. A data word on the input 21 is therefore evaluated in parallel upon a clock pulse on the clock signal input CLK of the address unit ADR and is stored in one of the register devices R1, R2 or R3.

Transfer to the register device 20 and later signal processing occurs upon a system clock which is generated within the radio-frequency chip. This clock may differ from an externally used clock both in terms of its frequency and in terms of its phase. In this connection, reference is made to a synchronism between an external clock signal and the internally used clock signal. For programming the individual registers R1, R2 and R3 within the register device 20, the "three-wire bus" has become established as a standard. This comprises a data line on which the individual data bits are transmitted in serial form. A number of data bits is combined to form a data word or a "message". Transmission of a data word is indicated on a "Enable line" in the form of a signal. In addition, provision is made for each data bit of a data word to be transmitted upon a clock edge of a clock signal on a third line in the three-wire bus. Since the clock signal on the third line in the three-wire bus is frequently out of sync with the internally used system clock, it is necessary to synchronize the individual data bits or the data word to the internally used system clock.

To this end, the memory device contains a buffer store 8 which comprises a first input 1 for supplying the data word TWB_DATA. The individual data bits of the data word TWB_DATA on the input 1 are read in serially. To this end, the buffer store 8 contains a clock signal input 2 for supplying the external clock signal TWB_CLK. A further input 3 has the state signal TWB_DATA_EN_N applied to it, which indicates whether a data word TWB_DATA is being transmitted on the data line.

The buffer store 8 reads in the externally applied data word TWB_DATA on its input using the external clock signal TWB_CLK on the clock input 2. The output of the buffer store 8 is connected to a multiplexer unit 9. The output 91 of this multiplexer unit 9 is connected to the data input 21 of the register device 20. The multiplexer unit 9 also comprises a control input 92. The control input has a signal supplied to it. The multiplexer unit 9 can use this signal to select one of its two inputs and to connect it to its output 91. In this embodiment, the buffer store 8 converts the data word which is being read in serially into a parallel data word and outputs it on its output.

For the purpose of synchronization, a synchronization circuit is provided. This contains a synchronizer 66 whose inputs are connected to the state input 3 for the state signal TWB_DATA_EN_N and to a second clock input 4 for the internal clock signal SYS_CLK. In one embodiment, the synchronizer 66 contains two series-connected flipflop circuits which are used to synchronize the state signal TWB_DATA_EN_N to the internally used system clock, the clock signal SYS_CLK. In this case, TWB_DATA_EN_N is applied to the data input of the first flipflop, and SYS_CLK is used as clock signal. Alternatively, other synchronization schemes may be employed and are contemplated by the present invention.

In addition, the synchronizer 66 is also used to check the presence of the internal clock signal SYS_CLK. To this end, the synchronizer 66 outputs an appropriate switching signal SYNC_Mode. If the internal system clock is running, this signal changes it state, for example from the "high" state to the "low" state, indicating that a data word needs to be transferred to the register device in sync with the internally used clock signal SYS_CLK.

In addition, a pulse generator 70 is provided which has a first input connected to the state input 3 and which has a second input connected to the second clock input. The pulse generator 70 takes a rising edge of the state signal TWB_DATA_EN_N and generates a pulse which has a certain length in order to allow synchronization to the second clock signal SYS_CLK. At the same time, this pulsed signal is synchronized to the second clock signal SYS-CLK using, for example, two further series-connected flipflops.

The control circuit 60, whose input is connected to the pulse generator 70 and to the synchronizer 66, evaluates the different signals and generates a clock signal on its output 621a at the correct time. The clock signal on the output 621a is generated whenever a data word is applied to the data input 21 of the register device 20. This data word is then transferred from the register device 20 to the appropriate register R1, R2 or R3.

If the second clock signal SYS_CLK is not active, the control circuit 60 is notified of this by the synchronizer 66. In this case, the control circuit 60 takes the state signal TWB_DATA_EN_N and generates a clock signal, and outputs this clock signal to the register 20. This ensures that the register device 20 accepts a data word applied to its input 21 even without a second clock signal.

FIG. 2 shows a specific example embodiment with the different clock signals, the buffer store 8 and the control circuit 60. Components which have the same action or function bear the same reference symbols. In this case, the buffer store 8 comprises two shift registers 80 and 85 which are designed to output a parallel data word. The outputs of the shift registers 801 and 851 are connected to the inputs 93 and 94 of the switch or multiplexer 9.

The data inputs 802 and 852 of the shift registers 80 and 85 are connected to the data input 1 for supplying the serial data word TWB_DATA. Their clock inputs CLK are connected to clock gates 86 and 84. The clock signal inputs CLK of the two clock gates 86 and 84 are connected to the first clock signal input 2 for supplying the external clock signal TWB_CLK. In addition, the clock gates 86 and 84 contain an activation input EN. This activates the respective clock gate, as a result of which the clock signal on the clock signal input CLK is output on the relevant output gCLK.

The two clock gates 86 and 84 are actuated alternately. To this end, the activation inputs EN have a respective logic AND gate 83 connected upstream of them. Two first inputs of the logic AND gates 83 are connected to the state input 83 for the state signal TWB_DATA_EN_N. A first input of the logic AND gate 83 for the clock gate 86 is connected via an inverter 81 firstly to the first input of the logic AND gate 83 for the second clock gate 84 and secondly to a data output Q of a flipflop 82. The flipflop 82 is in the form of a feedback flipflop. The inverted data output Q' is fed back to its data input. As clock signal, the flipflop receives the state signal TWB_DATA_EN_N on its clock input.

With this circuit, the two clock gates 86 and 84 alternate upon each rising clock edge of the state signal TWB_DATA_EN_N. A serial data word TWB_DATA applied to the data input 1 after a falling edge of the state signal TWB_DATA_EN_N is read into the respective selected shift register 80 or 85 using the external clock signal TWB_CLK. The outputs 801 and 851 of the shift register 80 or 85 produce a respective parallel data word comprising n data bits and k address bits. These are supplied to the respective changeover switch 9.

The second shift register, including the second clock gate, advantageously provides sufficient time for synchronization. This ensures that a serial data word can be transmitted to the register device 20. If a further word is applied to the data input 1 during the synchronization operation, which admittedly requires some time, it can be written to the second shift register which is now selected.

For the purpose of synchronization and particularly for the purpose of transferring the data word to the register device 20, the control circuit is supplied with the control signal SYNC_MODE on its input 6. This control signal is generated from the synchronization circuit 66 and indicates whether the second clock signal SYS_CLK is present and therefore whether the register device 20 can be programmed in sync with the second clock signal. To this end, the input 6 simultaneously also forms a control input of a switch 62. The switch 62 comprises a first input 63 and a second signal input 62. Its output is connected to the clock input CLK of the register device 20.

In addition, the output 621 of the switch 62 is routed to the clock signal input of a feedback flipflop 61. The data output Q of the feedback flipflop 61 is connected to the control input 92 of the switch 9 for the purpose of selecting one of its two inputs 93 or 94. The feedback flipflop 61 inverts its data output Q upon each clock signal on the output 621 of the switch 62 and thus alternately couples one of the two inputs 93 and 94 to the output 91 of the switch 9.

A first input 623 of the switch 62 is connected to the state input 3 for the state signal TWB_DATA_EN_N. If there is no second clock signal present, the control signal SYNC_Mode switches the switch 62 such that the clock input CLK of the register device 20 receives the state signal TWB_DATA_EN_N as a clock. Upon a rising clock edge indicating the end of a serial data word TWB_DATA on the input 1, this data word is transferred to the register device.

The second input 622 of the switch 62 is connected to an output of a clock gate 63. A clock input CLK of the clock gate 63 is supplied with the second clock signal SYS_CLK on the second clock signal input 4. The clock gate 63 likewise has an activation input EN which is connected to the output of a logic gate 64. A first input of the logic AND gate 64 is routed to the pulse input 5 for the purpose of supplying the synchronized pulse EN_STB_SYNC from the pulse generator 70. A second input of the logic gate is routed to the inverted data output of a flipflop 65. The data input of the flipflop 65 is connected to the pulse input 5, and the clock signal input is connected to the second clock signal input 4.

The pulse generator 70 generates the synchronized pulsed signal EN_STB_SYNC using two series-connected flipflops.

This pulsed signal is used to activate the clock gate 63. In this case, the flipflop 65 and the logic AND gate 64 ensure that the clock gate 63 always outputs just one clock pulse from the second clock signal SYS_CLK to the input 622 of the switch 62.

FIG. 3 shows various example signals of a sequence for programming a data word with the synchronization signals. Clearly visible is the interval of time between two clock signals between the state signal TWB_DATA_EN_N and the synchronized state signal DATA_EN_SYNC_N formed in the synchronizer 66 of FIG. 1, and used for generating the signal SYNC_Mode. The time shift stems from the evaluation using the two series-connected flipflops by the synchronizer 66. Upon a rising clock edge of the state signal TWB_DATA_EN_N which simultaneously also indicates the end of the data word, an appropriate pulsed signal with a length of two clock edges is generated.

The pulsed signal TWB_EN_STB does not need to be in sync with the second clock signal SYS_CLK. Synchronization is effected likewise using two series-connected flipflops and results in the synchronized pulsed signal EN_STB_SYNC. This synchronization is performed by the generator circuit 70 of FIG. 1.

FIG. 4 shows the rest of the sequence for programming using the various signals. At time A, the state signal TWB_DATA_EN_N changes from the logic low state to the logic high state and indicates the end of a data word. At about the same time, a pulse TWB_EN STB is generated. This pulse is of sufficient length to ensure synchronization to the second clock signal SYS_CLK. In the generator circuit 70 and in the synchronizer 66 the state signal TWB_DATA_EN_N and the pulsed signal TWB_EN_STB are synchronized to the second clock signal SYS_CLK. The two synchronized signals DATA_EN_SYNC_N and EN_STB_SYNC change to a logic high state two clock cycles after the time A.

At the same time, the signal on the data output Q of the flipflop 82 changes from a logic low level to a logic high level at time A. This changes the shift register in the auxiliary memory 8 and activates the previously unused shift register to store a further data word.

The synchronized pulsed signal EN_STB_SYNC is supplied to the data input D of the flipflop 65. This changes the inverted output Q' of the flipflop 65 to a logic high level. The result of this is that the clock gate 63 is now activated and forwards precisely one clock edge to the selection switch 62 at time B. This clock edge serves to transfer the data word applied to the data input 21 of the register device 20 to said register device.

The time at which the switch 62 is used to change over from the state signal TWB_DATA_EN_N to the second clock signal SYS_CLK is important because it is necessary to ensure that the second clock gate 63 is not transparent at this time. Otherwise, clock signals would be applied to the input 622 of the switch 62, which would result in an incorrect response in the register device 20. This is necessary particularly when using the memory device for signals based on the DigRF standard.

Figure 6A:
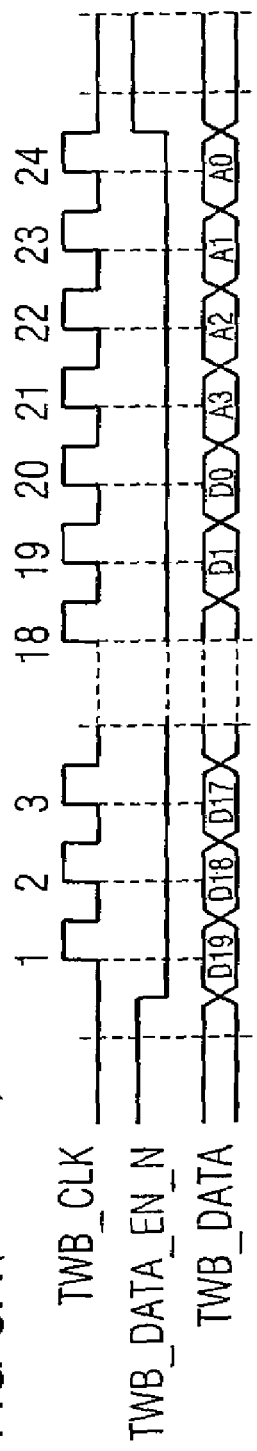
FIGS. 6A to 6C show a plurality of prior art signal timing diagrams to illustrate signals on a three-wire bus.
Figure 6B:
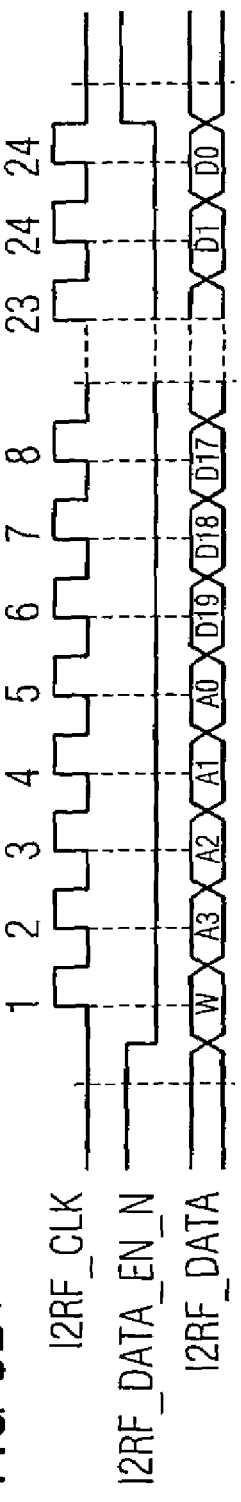
Figure 6C:
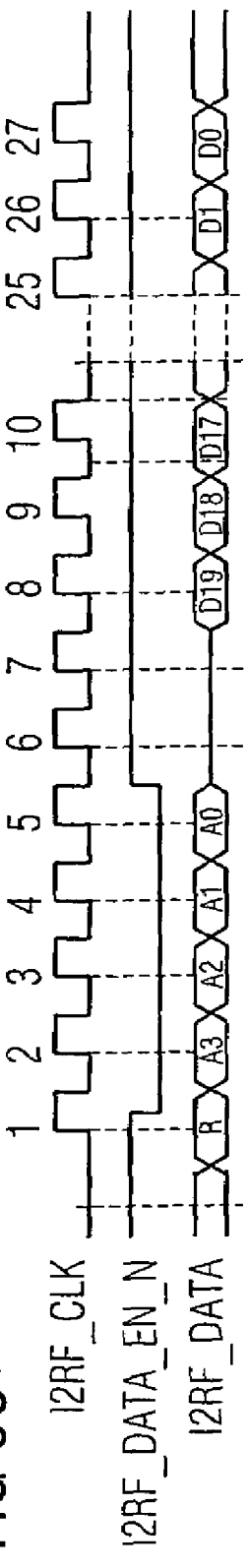

The minimum length at which the state signal TWB_DATA_EN_N has the logic low state for read access for the DigRF standard is five clock cycles. This is made up, as can be seen in FIG. 6c, from a Write bit or Read bit W, R and the four succeeding address bits A0, . . . , A4. So that the synchronization of the state signal TWB_DATA_EN_N to the second clock signal SYS_CLK and the generation of the synchronized state signal DATA_EN_SYNC_N can be safely concluded, it is necessary to wait at least three clock cycles of the second clock signal SYS_CLK. Reading the synchronized signal also requires a further clock cycle. This means that the switch 62 can be changed over four clock cycles after the occurrence of the edge of the state signal TWB_DATA_EN_N. There then also remains a safety reserve clock cycle before the clock gate 63 allows the programming signal CLK_REG to pass. In principle, however, the number of address and data bits is not stipulated. Turning off the second clock signal SYS_CLK is simpler, since the design means that no further clock signal is able to come for a time after the data word is transferred to the register device 20. It is therefore possible to switch back to the state signal TWB_DATA_EN_N without any risk.

Another effect achieved when generating the programming signal CLK_REG is that the flipflop 61 changes over and hence the data and the address from the respective other shift register 80 or 85 are applied to the data input 21 of the register device 20. The invention ensures that the externally supplied data words are stored in the register device 20 in sync with the second signal clock whenever possible. This means that they can be used by the further circuit elements without requiring additional synchronization of the individual data bits. Accordingly, synchronization is performed at a central location. At the same time, it continues to be ensured that when a second clock signal is not used the data word is transferred to the respective register device 20 upon every second clock edge of the state signal TWB_DATA_EN_N. This is particularly expedient because this state signal indicates whether there are data on the data line.

Figure 5:
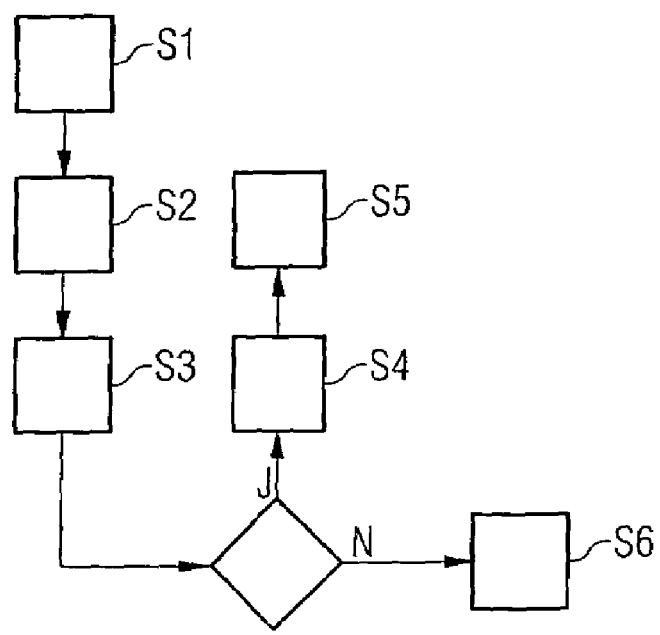
FIG. 5 is a flow chart diagram illustrating an exemplary embodiment of the method according to the invention.

FIG. 5 shows an embodiment of the method. While, for purposes of simplicity of explanation, the methodology and variations thereof described below are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the invention.

In a first act S1, a first clock signal, a state signal and a serial data word are provided. The state signal has a first and a second state. It is in the first state whenever data bits are being transmitted. Otherwise, it has the second state. In addition, a register device for storing the serial data word is provided.

At S2, the serial data word is buffer-stored using the first clock signal. This buffer storage can take place, for example, in shift registers. Alternatively, it is also conceivable for the serial data word to be converted into a parallel data word and for this parallel data word to be provided for subsequent transfer to the register device.

Next, a check is performed at S3 to determine whether a second clock signal is present. If this signal exists, it is expedient to synchronize the data word which is to be stored to the second clock signal and to transfer it to the register device in sync with the second clock signal. As a result, there is the continued assurance that no losses of data or data errors can occur during the transfer. If the second clock signal is not present, the state signal can be used for this in suitable fashion.

If the second clock signal is present, a pulse is generated from the state signal at S4 and this pulse is synchronized to the second clock signal. A pulse is generated, for example, when a clock edge appears in the state signal. Next, at S5 the pulse generated in this manner is synchronized to the second clock signal, and the clock pulse is generated using the synchronized pulse and with a time shift relative to the appearance of the clock edge in the state signal.

The buffer-stored data word is then transferred to the register device upon this clock pulse.

If the second clock signal is not present, at S6 the buffer-stored data word is transferred to the register device using the state signal. This is done by evaluating the state signal over time, which involves transferring the parallel data word to the register device, preferably when a clock edge appears in the state signal or with a shift relative to this clock edge which has appeared in the state signal.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

The invention claimed is:

1. A memory device, comprising:
   a first clock input configured to receive a first clock signal;
   a second clock input configured to receive a second clock signal;
   a data input configured to receive a serial data word;
   a state input configured to receive a state signal;
   a register device comprising a data input and a clock signal input, and configured to accept a data word on its data input based on a clock signal on the clock signal input thereof;
   a multiplexer device comprising a control input, a first and a second data input, and a data output which is coupled to the data input of the register device, wherein the multiplexer device is configured to couple one of its data inputs to its data output based on a signal on the control input thereof;
   a buffer store comprising a first and a second data output coupled to a respective data input of the multiplexer device, wherein the buffer store is configured to accept the serial data word on the data input based on signals on the first clock input and on the state input, and configured to output a parallel data word to one of the two data outputs;
   a synchronization circuit comprising a control output coupled to the control input of the multiplexer device, a clock signal output coupled to the clock signal input of the register device, and inputs coupled to the second clock input and to the state input, respectively, wherein the synchronization circuit is configured to generate and output the clock signal to the clock signal output thereof, wherein the clock signal is derived from a time profile of the signal on the state input and the signal on the second clock input.

2. The memory device of claim 1, wherein the synchronization circuit comprises a switch having a control input, and an output that forms the clock signal output, and wherein the switch further comprises a first input coupled to the state input and a second input coupled to a clock generator, and wherein the switch is configured to selectively couple one of its inputs to its output based on a synchronization signal.

3. The memory device of claim 2, wherein the synchronization circuit further comprises a synchronizer configured to output the synchronization signal, the synchronizer comprising two series-connected flipflops whose clock signal inputs are connected to the second clock signal input, and a data input of the first flipflop is coupled to the state input, and wherein an output of the synchronizer is coupled to the control input of the switch in the synchronization circuit.

4. The memory device of claim 2, wherein the clock generator in the synchronization circuit comprises a clock gate configured to output a clock pulse that is derived from the signal on the second clock input and from a pulse generated from an edge of the state signal.

5. The memory device of claim 1, wherein the control output of the synchronization circuit is coupled to a data output of a feedback flipflop circuit whose clock input is coupled to the clock signal output.

6. The memory device of claim 1, wherein the buffer store comprises a first and a second shift register whose inputs are connected to the data input and whose outputs form the first and second data outputs of the buffer store.

7. The memory device of claim 6, wherein the buffer store comprises an actuating circuit configured to alternately actuate the first and second shift registers for storing the serial data word, wherein the actuating circuit is coupled to the first clock input and to the state input.

8. The memory device of claim 6, wherein the buffer store comprises a first clock gate having an activation input and a second clock gate having an activation input, wherein the first clock gate is coupled to the first shift register in order to actuate it and the second clock gate is coupled to the second shift register in order to actuate it, respectively.

9. The memory device of claim 1, wherein the register device comprises a plurality of registers and an address unit, wherein the address unit is configured to store at least one portion of the data word on the data input in one of the registers based on the data word.

10. The memory device of claim 1, wherein the data input, the first clock input and the state input are coupled to a three-wire bus in a radio-frequency circuit.

* * * * *

UNITED STATES PATENT AND TRADEMARK OFFICE
CERTIFICATE OF CORRECTION

PATENT NO. : 7,420,869 B2
APPLICATION NO. : 11/412755
DATED : September 2, 2008
INVENTOR(S) : Markus Lindorfer et al.

It is certified that error appears in the above-identified patent and that said Letters Patent is hereby corrected as shown below:

Column 2, line 25: please replace "TWB CLK" with --TWB_CLK--
Column 6, lines 31 & 32: please replace "a synchronism" with --asynchronism--

Signed and Sealed this

Twenty-eighth Day of October, 2008

JON W. DUDAS
*Director of the United States Patent and Trademark Office*